United States Patent
Ju

(10) Patent No.: US 9,609,770 B2
(45) Date of Patent: Mar. 28, 2017

(54) HINGE TORQUE FIXING STRUCTURE

(71) Applicant: LEECO Technologies Corporation, New Taipei (TW)

(72) Inventor: Danny Ju, Taipei (TW)

(73) Assignee: LEECO TECHNOLOGIES CORPORATION, New Taipei (TW)

( * ) Notice: Subject to any disclaimer, the term of this patent is extended or adjusted under 35 U.S.C. 154(b) by 0 days.

(21) Appl. No.: 14/944,661

(22) Filed: Nov. 18, 2015

(65) Prior Publication Data

US 2016/0069115 A1    Mar. 10, 2016

Related U.S. Application Data

(63) Continuation-in-part of application No. 14/295,375, filed on Jun. 4, 2014, now abandoned.

(51) Int. Cl.
| | |
|---|---|
| *H05K 5/02* | (2006.01) |
| *G06F 1/16* | (2006.01) |
| *E05D 11/08* | (2006.01) |

(52) U.S. Cl.
CPC ......... *H05K 5/0226* (2013.01); *G06F 1/1681* (2013.01); *E05D 11/084* (2013.01); *E05Y 2900/606* (2013.01); *Y10T 16/54038* (2015.01)

(58) Field of Classification Search
CPC ........... Y10T 16/5403; Y10T 16/54035; Y10T 16/54038; G06F 1/1616; G06F 1/1681; H04M 1/0216; H04M 1/0214; E05Y 2900/606; E05D 11/082; E05D 11/084; E05D 2011/085; E05D 5/08; H05K 5/0226

USPC .............. 16/337, 341, 342; 379/433.13; 455/575.3; 361/679.27
See application file for complete search history.

(56) References Cited

U.S. PATENT DOCUMENTS

| | | | | |
|---|---|---|---|---|
| 6,085,388 A | * | 7/2000 | Kaneko ................ | G06F 1/1616 16/274 |
| 6,301,748 B1 | * | 10/2001 | Su-Man ................ | G06F 1/1616 16/337 |
| 6,317,927 B1 | * | 11/2001 | Lai ........................ | G06F 1/1681 16/338 |
| 6,711,782 B1 | * | 3/2004 | Su ........................ | G06F 1/1616 16/337 |
| 7,500,288 B2 | * | 3/2009 | Chung .................. | E05D 11/082 16/342 |
| 7,578,031 B2 | * | 8/2009 | Hung .................. | E05D 11/1014 16/275 |

(Continued)

*Primary Examiner* — William Miller
(74) *Attorney, Agent, or Firm* — Panitch Schwarze Belisario & Nadel LLP

(57) ABSTRACT

A hinge torque fixing structure, comprising a hinge, a fulcrum and a torque shrapnel, wherein one end of the hinge is used for connecting a main body of electronic products, and the opposite end is provided with a circular hinge hole; one end of the fulcrum is used for connecting a lid of the main body, which is characterized in: the torque shrapnel is a ring-shaped polygonal shrapnel, wherein one end of the torque shrapnel is provided with an opening, each of two ends of the opening forming an outwardly protruding flange; when the torque shrapnel is disposed between the hinge and the hinge hole, the torque by rotating the hinge relative to the hinge hole is enhanced to keep the hinge closely rotated relative to the hinge hole without loose when there is an angle therebetween during positioning.

7 Claims, 13 Drawing Sheets

(56) References Cited

U.S. PATENT DOCUMENTS

| | | | | |
|---|---|---|---|---|
| 7,584,525 | B2* | 9/2009 | Chern | G06F 1/1616 |
| | | | | 16/342 |
| 7,607,202 | B1* | 10/2009 | Lee | G06F 1/1616 |
| | | | | 16/342 |
| 7,984,532 | B2* | 7/2011 | Huang | G06F 1/1616 |
| | | | | 16/342 |
| 8,402,609 | B2* | 3/2013 | Chien | E05D 11/1014 |
| | | | | 16/342 |
| 2002/0121002 | A1* | 9/2002 | Wu | G06F 1/1616 |
| | | | | 16/342 |
| 2005/0034274 | A1* | 2/2005 | Wu | G06F 1/1616 |
| | | | | 16/342 |
| 2007/0119026 | A1* | 5/2007 | Lee | G06F 1/1616 |
| | | | | 16/342 |
| 2007/0192994 | A1* | 8/2007 | Chuang | G06F 1/1681 |
| | | | | 16/342 |
| 2007/0199180 | A1* | 8/2007 | Chen | E05D 11/082 |
| | | | | 16/342 |
| 2007/0214605 | A1* | 9/2007 | Tu | G06F 1/1616 |
| | | | | 16/342 |
| 2008/0151476 | A1* | 6/2008 | Chern | G06F 1/1616 |
| | | | | 361/679.27 |
| 2008/0151477 | A1* | 6/2008 | Chern | G06F 1/1616 |
| | | | | 361/679.27 |
| 2008/0151478 | A1* | 6/2008 | Chern | G06F 1/1616 |
| | | | | 361/679.27 |
| 2008/0263826 | A1* | 10/2008 | Huang | G06F 1/1616 |
| | | | | 16/342 |
| 2010/0071161 | A1* | 3/2010 | Wang | G06F 1/1616 |
| | | | | 16/339 |

* cited by examiner

HINGE TORQUE FIXING STRUCTURE

BACKGROUND OF THE INVENTION

1. Field of the Invention

The present invention relates to a hinge torque fixing structure, particular to a structure by which torque between a hinge hole and a hinge rotated to each other is enhanced through the intervention of a ring-shaped polygonal shrapnel and can be positioned accurately when rotating at any angle without unexpected loose.

2. Description of the Related Art

All electronic products available in the market today, such as laptop, mobile phone, translation machine, PDA (personal digital assistant), have a main body and a screen that can be hinged or rotated by a certain angle relative to the main body. To achieve the effect of the aforementioned hinge or rotating, the invention of a hinge or a rotating-axle structure is provided.

For example, ROC Patent No. 420321 has disclosed a fixed base, a hinge, a positioning plate, and a tube spring, wherein the fixed base and hinge can be disposed in the main body and computer screen respectively. One side of the fixed base is formed with a connection hole. An H-shape-groove is provided and connected to the lateral side of the connection hole. One end of the tube spring in a sheet form is a straight plate and a protruding portion is formed at one end of the straight plate. The opposite end of the tube spring is a hollow tube in which a hinge hole is available for one end of a hinge shaft to insert therethrough. The aforementioned tube spring can be disposed at the connection hole and positioned within the H-shape groove.

However, the assembled structure of the application is too complicated and may require high manufacturing costs. Furthermore, parts abrasion would affect the overall functionality.

Further, ROC Patent No. M388814, as shown in FIG. 1, has disclosed a rotating-axle structure having the characteristic of elastic abutting and positioning, is provided with a hinge tube. A hinge shaft is disposed throughout the hinge tube. A fixed portion is provided in the hinge tube. The outer periphery of the hinge shaft is provided with a positioning portion which can be positioned with the fixed portion. Below the hinge shaft 100, the hinge is provided with an abutting element 200 having the elastic deflection and elastic displacement feature. One end of the abutting element 200 is formed with an abutting portion 201. The outer periphery of the hinge shaft 100, on one side of the positioning portion, is provided with a recess 101. The abutting portion 201 abuts against the inside of the recess 101. With the use of the elastic displacement capability of the abutting element 200, the hinge tube and the hinge shaft 100 can be operated together and positioned and push the hinge shaft 100 to eliminate the gap between the hinge tube and the hinge shaft 100, by which the hinge is positioned more stably, and the object with a hinge does not produce shaking in the positioned state.

In the patent application, the aforementioned abutting element with the elastic deflection and elastic displacement feature, which is disposed below the hinge, has the easily broken problem.

SUMMARY OF THE INVENTION

In view of the foregoing shortcomings in the prior art, the inventor studied a variety of methods based on manufacturing experiences and skills accumulated for various shafts, and finally designed and developed a new hinge torque fixing structure in the present invention after continuous research, experiments and improvement to solve the aforementioned shortcomings in the prior art.

Therefore, it is an objective of the present invention to provide a hinge torque fixing structure where a polygonal torque shrapnel having an opening is provided between a hinge shaft and a hinge hole. As the thickness of the polygonal torque shrapnel is slightly greater than a gap between the hinge shaft and the hinge hole, the assembly of the hinge shaft with the hinge hole is a tightly fit structure that can be properly rotated and immediately positioned.

According to the hinge torque fixing structure in the present invention, the polygonal torque shrapnel disposed between the hinge shaft and the hinge hole is integrally formed of a metal material. Also, upwardly protruding flanges are formed in the notched end of the polygonal torque shrapnel such that it is easy to be mounted into the hinge hole through a clamp. This is the secondary objective of the present invention.

According to the hinge torque fixing structure in the present invention, the flanges formed in the notched end of the polygonal torque shrapnel not only provide easy assembly, but also form a multi-point support with the peripheral edge of the hinge hole. When the hinge shaft is positioned without moving, it is fixed with the deformed torque shrapnel absorbing tight fit energy of the hinge shaft and the hinge hole. This is a further objective of the present invention.

The objective, shape, characteristics of the structure and effect of the present invention will become apparent by reference to the following embodiment in conjunction with the accompanying drawings, which are described in detail hereinafter:

DETAILED DESCRIPTION OF THE PREFERRED EMBODIMENT

Figure 1:
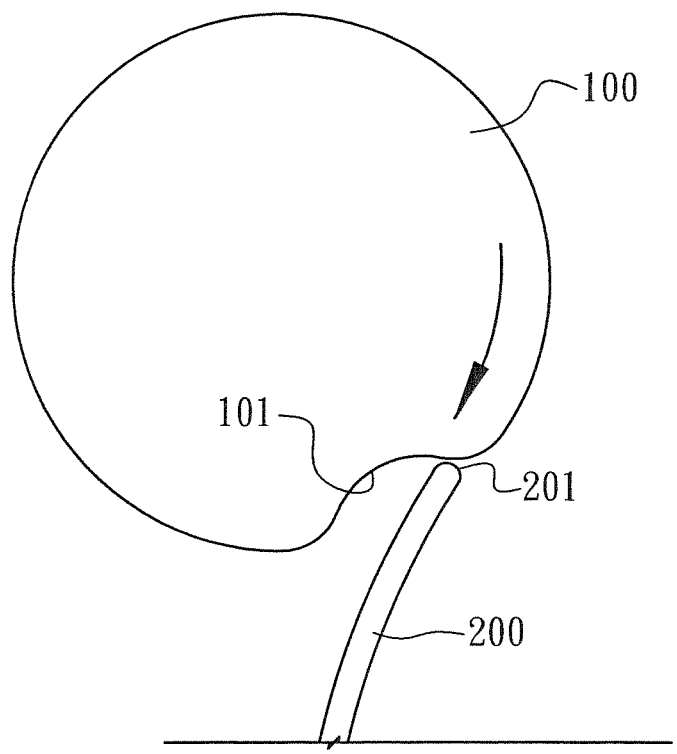
FIG. 1 is a schematic view showing the structure of ROC Patent No. M388814.
Figure 2:
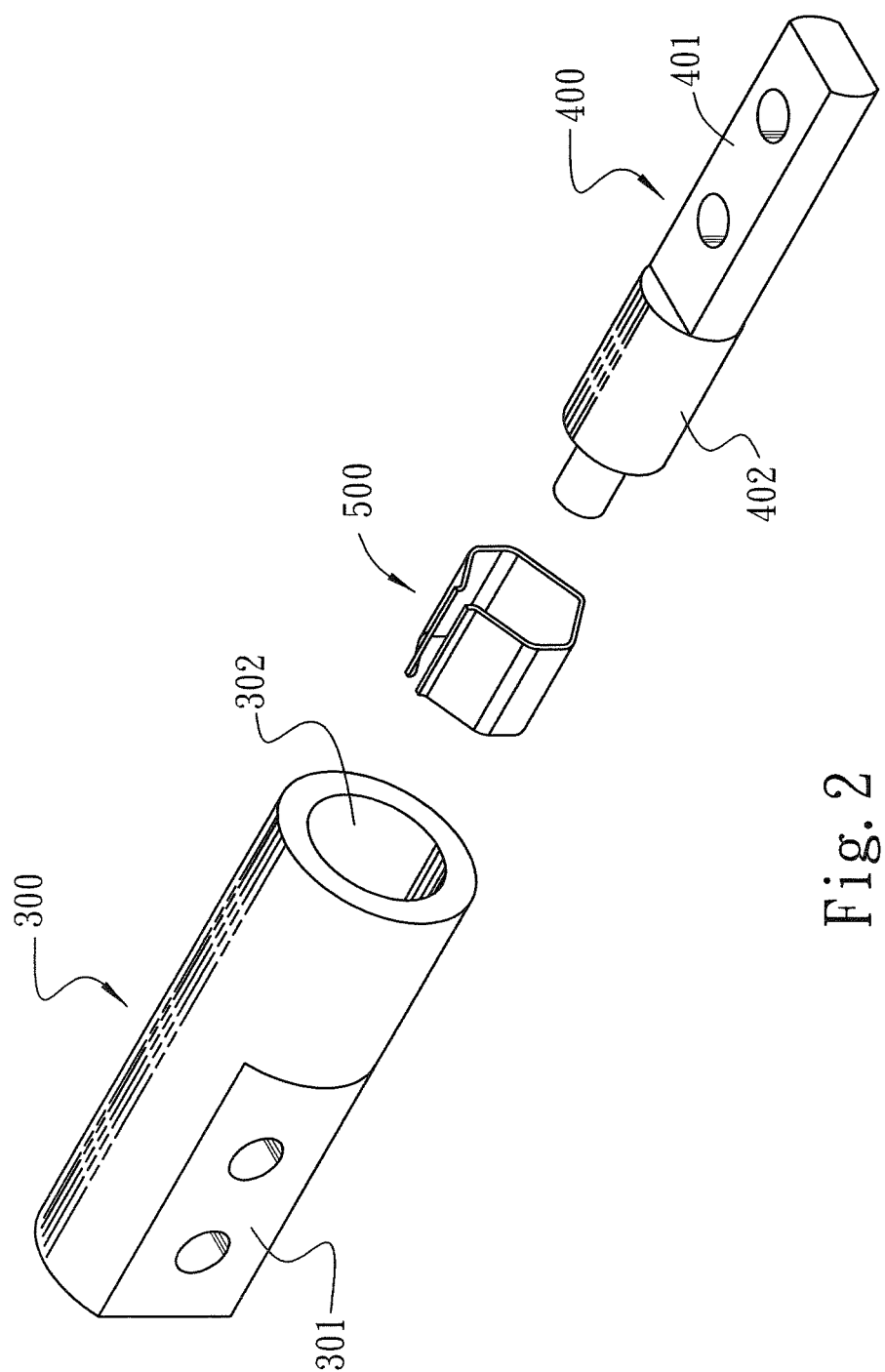
FIG. 2 is an exploded perspective view of the hinge torque fixing structure according to the present invention.
Figure 3:
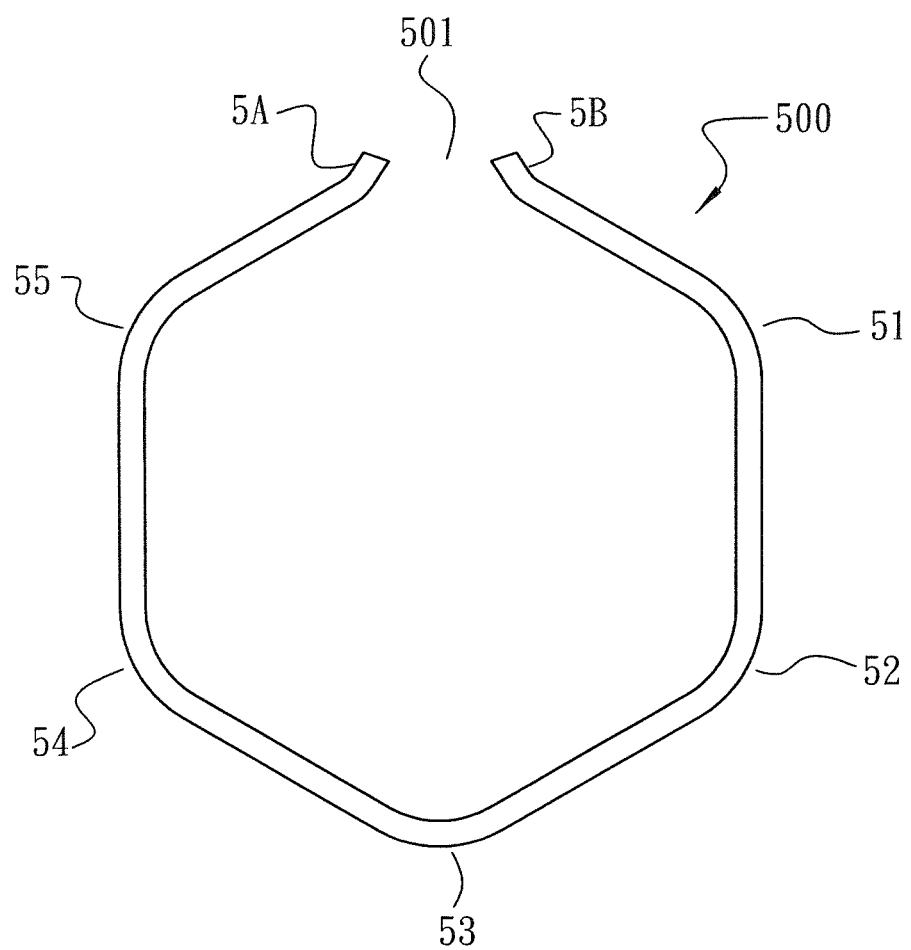
FIG. 3 is a plan view of the hinge torque fixing structure according to the present invention.

Please refer to FIGS. 2 and 3, the "hinge torque fixing structure" in the present invention includes: a hinge 300 and a fulcrum 400; wherein one end of the hinge 300 is provided with a connecting portion 301. A key hole is provided on the connecting portion 301 for connecting with a main body of an electronic product such as mobile phone and notebook computer. The opposite end of the hinge 300 is provided with a hinge hole 302 which is a circular hole. One end of the fulcrum 400 is also provided with a connecting portion 401. Several key holes are provided on the connecting portion 401 for connecting with a lid of the main body, such that the lid is closed and positioned relative to the main body. The opposite end of the fulcrum 400 is provided with a hinge shaft 402 to be inserted into the hinge hole 302 of the hinge.

As shown in the figure, a torque shrapnel 500 is provided between the hinge 300 and fulcrum 400. The torque shrapnel 500 is a ring-shaped polygonal shrapnel (which is hexagonal, but may be other polygonal shapes). One end of the torque shrapnel 500 is provided with an opening 501. Each of two ends of the opening 501 is formed with an outwardly protruding flange 5A, 5B respectively. The corner portions 51, 52, 53, 54, 55 of the torque shrapnel 500 are arc-shaped to be attached upon the inner wall of the hinge hole 302. The thickness of the torque shrapnel 500 is slightly greater than a gap between the hinge shaft 402 and the hinge hole 302. When the hinge shaft 402 is inserted into the hinge hole 302, it can be rotated and assembled through the torque shrapnel 500 which is disposed between the hinge shaft 402 and the hinge hole 302.

Figure 4:
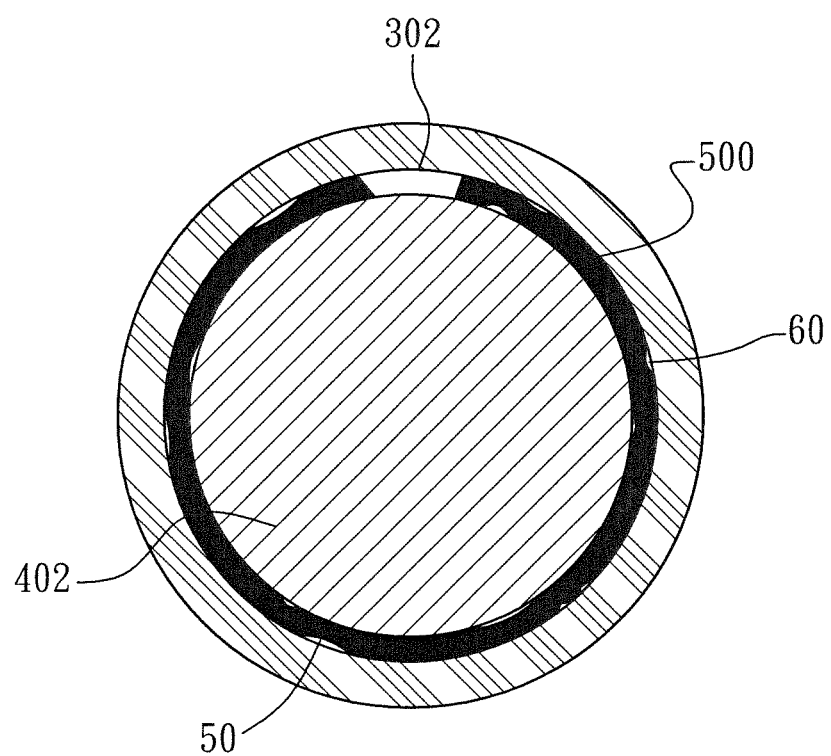
FIG. 4 is a cross-sectional view showing the assembly of the hinge torque fixing structure according to the present invention.

As shown in FIG. 4, the torque shrapnel 500 is made of metallic material having elasticity. Also, an outwardly protruding flange is provided to be against the confined space between the hinge shaft 402 and the hinge hole 302. Through the elastic deformation of the flange, pores 50, 60 can be formed in various positions between the hinge shaft 402 and the hinge hole 302 to provide a non-fixed combination of rotating and positioning the hinge shaft 402 with the hinge hole 302 in a timely manner.

Figure 5:
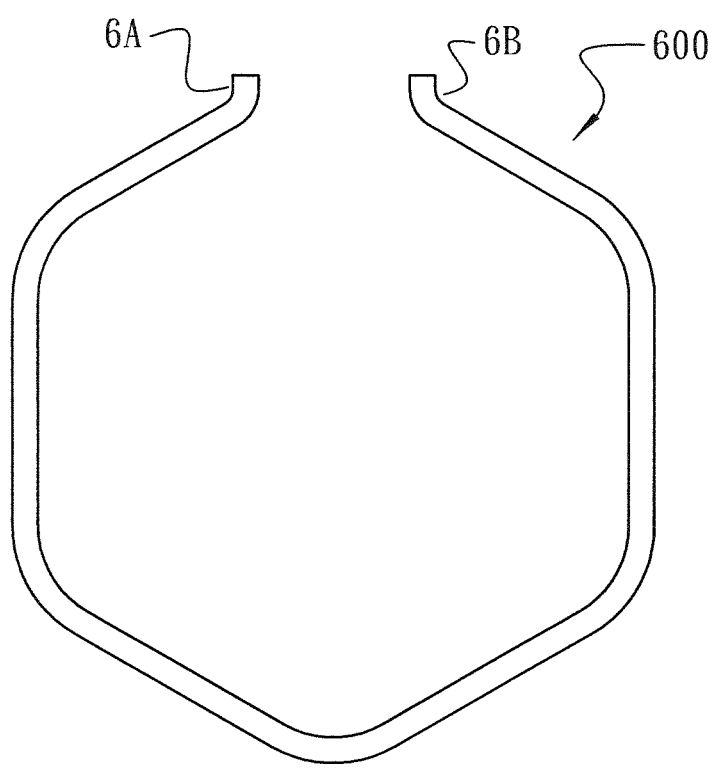
FIG. 5 is a plan view of a torque shrapnel in the hinge torque fixing structure according to a second embodiment of the present invention.
Figure 6:
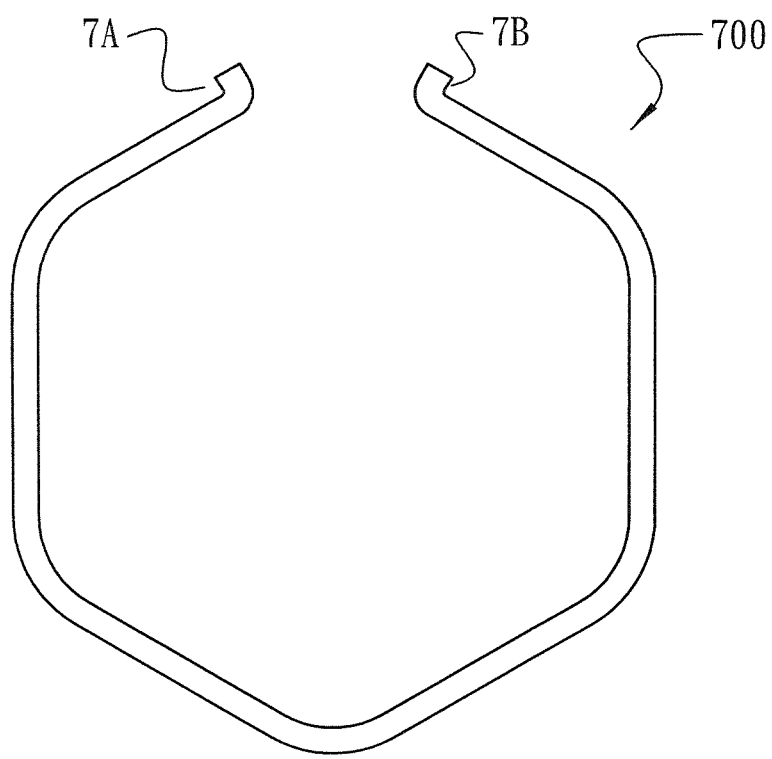
FIG. 6 is a plan view of the torque shrapnel in the hinge torque fixing structure according to a third embodiment of the present invention.
Figure 7:
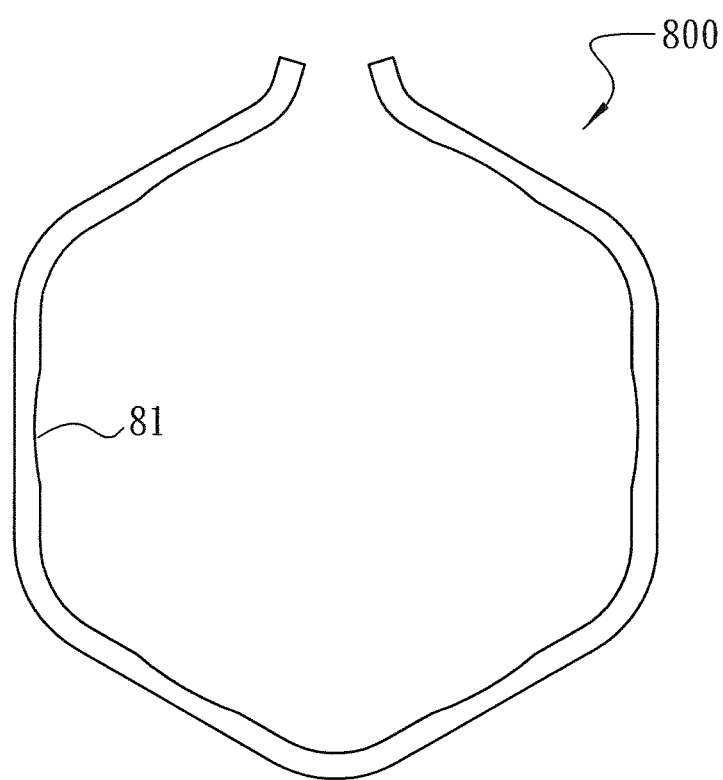
FIG. 7 is a plan view of the torque shrapnel in the hinge torque fixing structure according to a fourth embodiment of the present invention.
Figure 8:
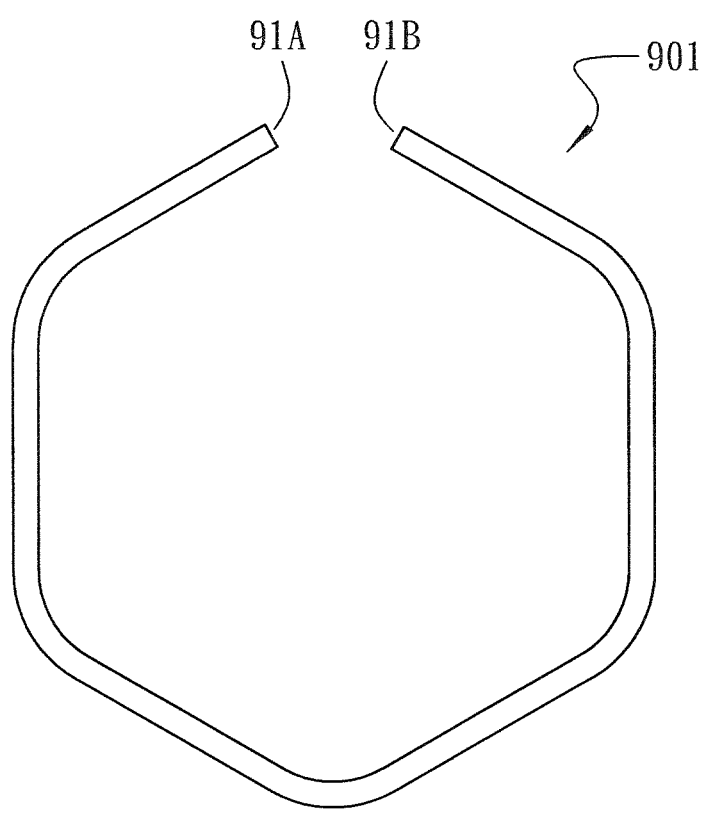
FIG. 8 is a plan view of the torque shrapnel in the hinge torque fixing structure according to a fifth embodiment of the present invention.
Figure 9:
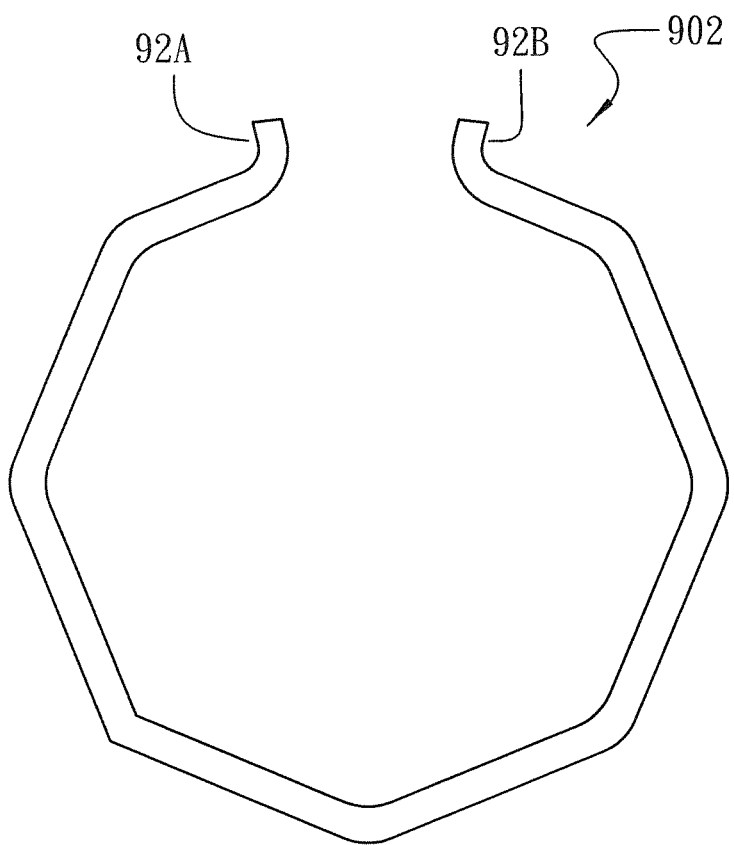
FIG. 9 is a plan view of the torque shrapnel in the hinge torque fixing structure according to a sixth embodiment of the present invention.

For the hinge torque fixing structure in the present invention, the torque shrapnel can be present in a variety of embodiments. In the torque shrapnel 600 as shown in FIG. 5, the flanges 6A, 6B are protruding radially. In the torque shrapnel 700 as shown in FIG. 6, the flanges 7A, 7B are everted radially. In the torque shrapnel 800 as shown in FIG. 7, the inner face of the shrapnel is provided with a curved groove 81 attached to the hinge shaft, which is in close contact with the outer periphery of the hinge. In the torque shrapnel 901 as shown in FIG. 8, two ends of the opening 91A, 91B are cross sections. The torque shrapnel 902 as shown in FIG. 9 is an octagonal (polygonal) shrapnel, and two ends of the flanges 92A, 92B are everted radially.

Figure 10:
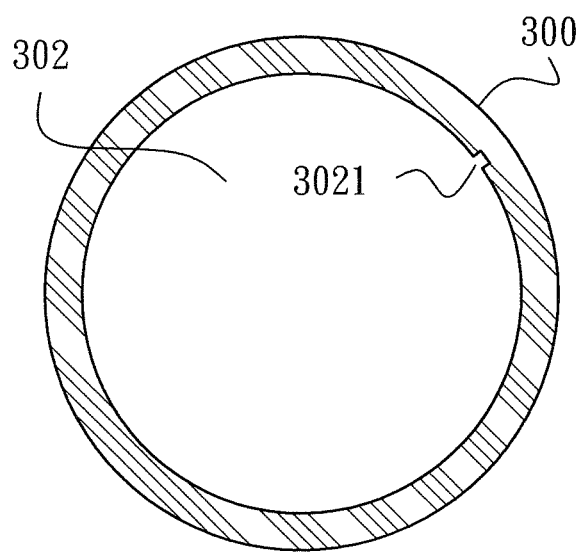
FIG. 10 is a plan view showing the seventh example of the hinge torque fixing structure of the present invention.
Figure 11:
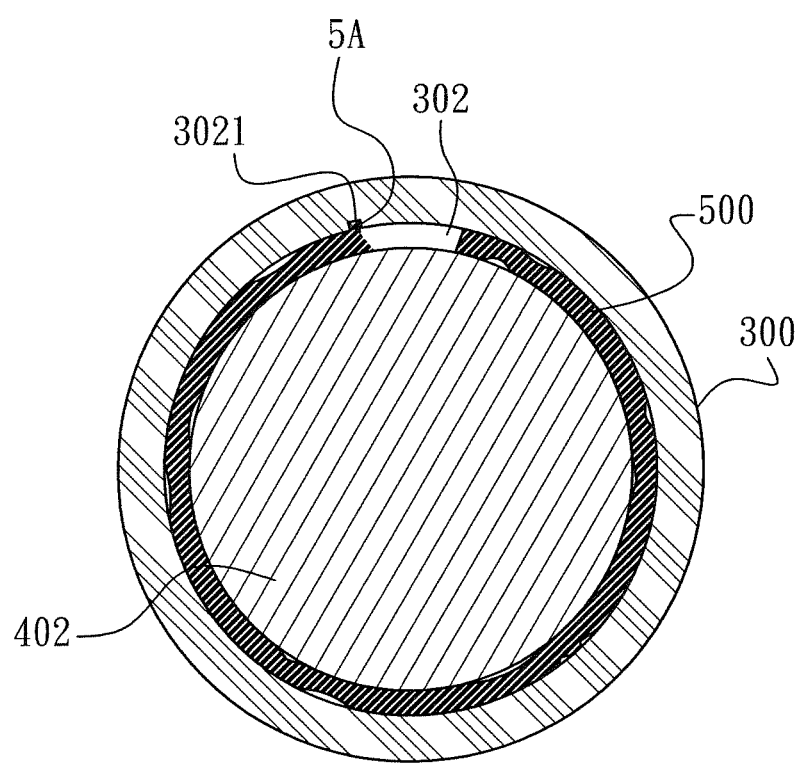
FIG. 11 is a plan view showing the eighth example of the present invention.

Please refer to FIG. 10, it is a plane view showing the seventh example of the hinge torque fixing structure of the present invention, wherein, the inner wall of hinge hole 302 of the hinge 300 is formed with at least one trench 3021, such that the protruding flange 5A or protruding flange 5B formed at two sides of the open of the torque shrapnel 500 can be mounted in and fixed inside the hinge 300, thus the torque shrapnel 500 cannot be rotated inside the hinge hole 302 after the rotation of hinge shaft 402 (as shown in FIG. 11). Therefore, when the hinge shaft 402 is rotated inside the hinge hole 302, by the pressing of torque shrapnel 500 to hinge shaft 402 due to the elasticity variation caused in the torque shrapnel 500, the hinge shaft 402 shall be fixed after it is rotated to any position.

Figure 12:
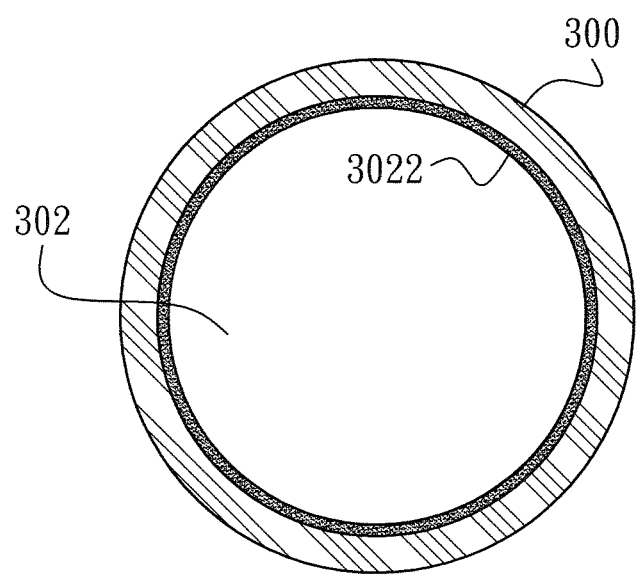
FIG. 12 is a plan view showing the ninth example of the present invention.

Please refer to FIG. 12, it is a plane view showing the ninth example of present invention, wherein, the inner wall of hinge hole 302 of the hinge 300 is formed with an interface layer 3022. By the material properties (for example: the soft characteristics), the protruding flange 5A, protruding flange 5B or sharp arc-shaped corner portions 51, 52, 53, 54, 55 of the torque shrapnel 500 to be attached to the interface layer 3022 and fixed inside the hinge 300, such that the torque shrapnel 500 can not be rotated inside the hinge hole 302 after the rotation of hinge shaft 402, That is, when the hinge shaft 402 is rotated inside the hinge hole 302, by the pressing of torque shrapnel 500 to hinge shaft 402 due to the elasticity variation caused in the torque shrapnel 500, the hinge shaft 402 shall be fixed after it is rotated to any position.

Figure 13:
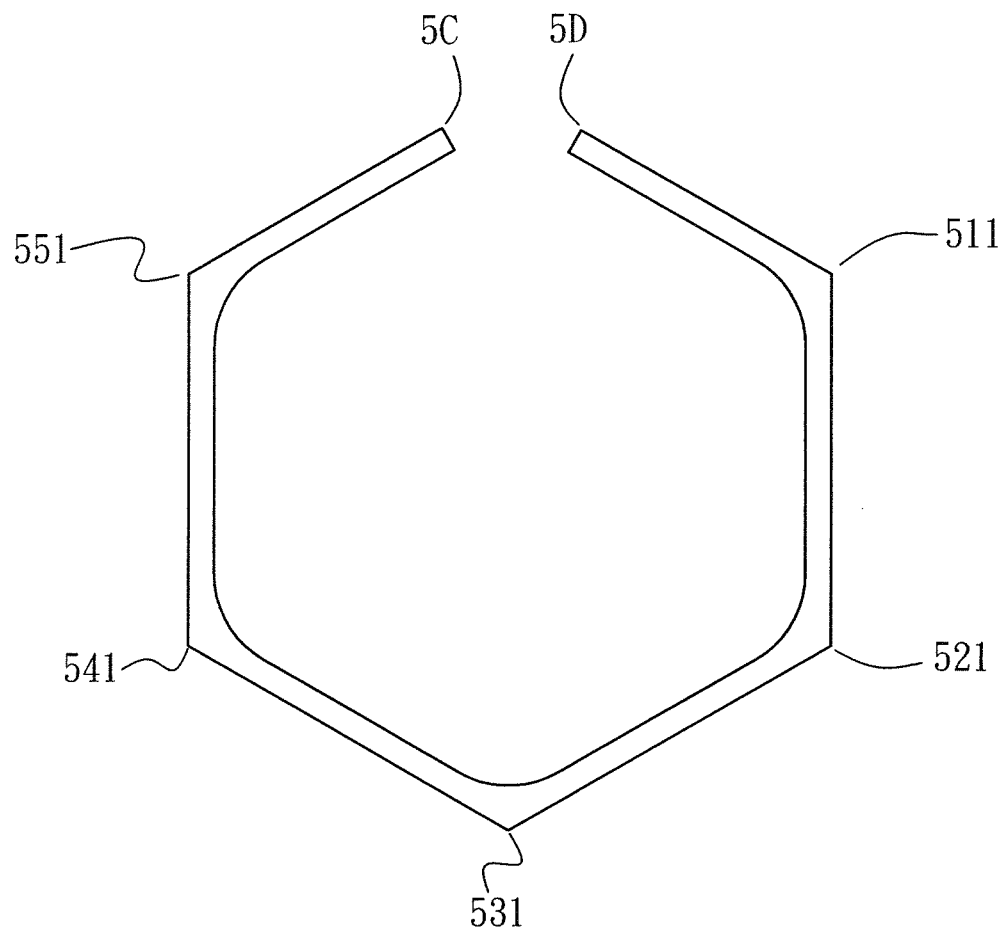
FIG. 13 is a plan view showing the tenth example of the present invention.

Please refer to FIG. 13, it is a plane view showing the tenth example of present invention, wherein, no protruding flange is formed on torque shrapnel 500, while two ends of the opening are formed in sharpened end 5C, 5D, and/or, the corner portions are formed as sharpened corners 511, 521, 531, 541, 551, so as to be mounted into said trench 3021 formed on the inner wall of hinge hole 302 or said interface, and then the torque shrapnel 500 shall not be rotated inside the hinge hole 302 after the rotation of hinge shaft 402. Through the aforementioned hinge torque fixing structure in the present invention, the polygonal shrapnel can be provided and arranged for the cylindrical hinge hole and hinge shaft to be quickly assembled, so that it can be rotated and positioned. Accordingly, the structure is more simplified, and thus manufacturing costs can be significantly reduced, and easy maintenance can be provided.

As described above, the hinge torque fixing structure in the present invention indeed has an unprecedented innovative structure, which is not found in any publication. Also, there are no similar products in the market. Therefore, the hinge torque fixing structure possesses novelty undoubtedly. In addition, the present invention has unique features and functionality far from the others in the art. It is indeed more inventive than the others in the art, and meets the requirements of the application requirements of the new patent law. Accordingly, the patent application has been filed in accordance with patent law.

Although the aforementioned are preferred embodiments of the present invention, the structure and features of the present invention are not limited thereto; various changes and modifications may be made to the described embodiments without departing from the scope of the invention as disposed by the appended claims.

What is claimed is:

1. A hinge torque fixing structure, comprising:
   a hinge having a first end provided with a connecting portion on which several key holes are disposed, and a second end provided with a hinge hole defined by an uninterrupted cylindrical wall;
   a fulcrum having a first end provided with a connecting portion on which several key holes are disposed and a second end provided with a hinge shaft to be inserted into the hinge hole; and
   a ring-shaped polygonal torque shrapnel having an interior surface and exterior surface is provided between the hinge hole of the hinge and the hinge shaft of the fulcrum, wherein the torque shrapnel has a plurality of corners, the shrapnel having a thickness extending between the interior and exterior surface that is slightly greater than a thickness of a gap extending between the hinge shaft and the hinge hole, such that after the hinge shaft is rotated by pressing the torque shrapnel to the hinge shaft due to elastic deflection in the torque shrapnel, the hinge shaft shall be fixed after it is rotated to any position.

2. The hinge torque fixing structure according to claim 1, wherein the torque shrapnel comprises at least one protruding flange formed at one side of an opening of the torque shrapnel.

3. The hinge torque fixing structure according to claim 2, wherein the at least one protruding flange of the torque shrapnel is everted radially.

4. The hinge torque fixing structure according to claim 1, wherein the corner of the torque shrapnel is provided with a sharp arc.

5. The hinge torque fixing structure according to claim 1, wherein the cylindrical wall of said hinge hole comprises at least one fixing construction, wherein the fixing construction comprises an interface layer.

6. The hinge torque fixing structure according to claim 1, wherein the torque shrapnel is a hexagonal, octagonal, or other polygonal shape.

7. The hinge torque fixing structure according to claim 1, wherein the torque shrapnel has a pair of linear terminal ends having longitudinal axes that intersect each other.

\* \* \* \* \*